United States Patent [19]

Tuffias et al.

[11] Patent Number: 4,917,968

[45] Date of Patent: Apr. 17, 1990

[54] HIGH TEMPERATURE CORROSION RESISTANT COMPOSITE STRUCTURE

[75] Inventors: Robert H. Tuffias, Los Angeles; John Harding, Van Nuys; Richard Kaplan, Beverly Hills, all of Calif.

[73] Assignee: ULTRAMET, Pacoima, Calif.

[21] Appl. No.: 182,127

[22] Filed: Apr. 15, 1988

[51] Int. Cl.$^4$ .............................................. B32B 15/0
[52] U.S. Cl. ................... 428/621; 428/610; 428/632; 428/660; 428/661; 428/668; 428/670
[58] Field of Search .............. 428/610, 627, 632, 660, 428/661, 668, 670, 621

[56] References Cited

U.S. PATENT DOCUMENTS

| | | | |
|---|---|---|---|
| 3,470,017 | 9/1969 | Rubin et al. | 428/660 |
| 3,540,863 | 11/1970 | Priceman et al. | 428/641 |
| 3,753,666 | 8/1973 | Carroll | 428/670 |
| 4,761,346 | 8/1988 | Naik | 428/661 |

OTHER PUBLICATIONS

Constitution of Binary Alloys, Second Supplement, by: Francis A. Shunk, pp. 461–462, 1969.

*Primary Examiner*—L. Dewayne Rutledge
*Assistant Examiner*—George Wyszomierski
*Attorney, Agent, or Firm*—Bruce A. Jagger

[57] ABSTRACT

A structure which is resistant to corrosion at high temperatures comprises a ductile layer of a platinum group metal, such as iridium, and a layer of a refractory metal having a high strength at high temperatures, such as rhenium. A solid solution of the two metals is present between and metallurgically bonded to the two metal layers. Further, the structure may include a layer of ceramic such as zirconia or hafnia on the exposed face of the platinum group metal layer.

6 Claims, No Drawings

HIGH TEMPERATURE CORROSION RESISTANT COMPOSITE STRUCTURE

The U.S. Government has a paid-up license in this invention and the right in limited circumstances to require the patent owner to license others on reasonable terms as provided for by the terms of contract No. NAS 3-24868 awarded by the National Aeronautics and Space Administration.

BACKGROUND OF THE INVENTION

This invention relates to high strength, high temperature corrosion resistant structures and their processes of preparation. More particularly, this invention relates to structures which are capable of sustaining heavy loads and withstanding highly corrosive environments at greatly elevated temperatures and pressures for hours or even days.

Previously considerable difficulty had been experienced in providing structures which retain their structural integrity at temperatures in excess 2,000 degree centigrade while sustaining substantial structural loads. In general, materials which can withstand environments under which most materials catastrophically oxidize do not have the structural strength to withstand substantial loads. Conversely, materials which have substantial structural strength at elevated temperatures are generally subject to catastrophic oxidation. These material limitations have substantially hampered developments and performance in a number of fields including, for example, that of rocketry. Rocket thrust chamber assemblies have, for example, been operated at less than optimum conditions so as to keep the operating temperatures within the limits of the material which had heretofore been available for use in the construction of thrust chambers and nozzles. Even when less than optimum operating conditions were used, the life of previous thrust chamber assemblies was generally limited to a very few minutes before catastrophic structural failure occurred.

These and other difficulties of the prior art have been overcome according to the present invention which provides a high temperature, high strength corrosion resistant structure which is capable of withstanding hot highly corrosive environments for several hours while supporting substantial structural loads.

According to the present invention, chemical vapor deposition procedures are utilized to form successive layers of a structure under conditions such that the layers are bonded together by an interlayer which is an admixture of the two adjacent layers. A first corrosion resistance layer is provided which is capable of withstanding highly corrosive environments at temperatures in excess of 1,500 degrees centigrade and preferably an excess of 2,000 or 2,200 degrees centigrade. The corrosion resistant layer is bonded through an interlayer to a high strength layer. The high strength layer exhibits tensile strengths in excess of 5,000 and preferably 15,000 pounds per square inch at temperatures in excess of 1,500 and preferably in excess of 2,000 degrees centigrade. In general, the structures according to the present invention are composed of platinum group metals such as, for example, iridium, and refractory materials, preferably metals such as, for example, rhenium. The structures may, if desired, be coated with high temperature ceramic materials such as, for example, hafnium dioxide or zirconium dioxide.

When thrust rockets are operated at the optimum oxidizer/fuel ratio, the temperature of the exhaust gas may be as high as 2,000 to 2,500 degrees centigrade. This is the condition at which the highest efficiency is achieved. It has heretofore been impossible to operate at these conditions because of the limitations imposed by the materials of construction for the thrust chamber assembly. An additional factor is of substantial significance in this area. Thrusters must be cycled on and off many times over their useful lives. The thrusters may cool between cycles to very low temperatures. Further, thrusters must withstand the forces imposed on space vehicles during launch and in use. The materials from which thrusters are constructed must withstand both structural and thermal shock. Brittle materials tend to fail rapidly because of an inability to withstand this shock. Premature failure because of cracking under hock greatly limits the useful life and reliability of the thruster. Very few materials or material combinations are capable of withstanding the shock loads, the structural loads, and the catastrophically corrosive conditions which are imposed on a rocket thrust chamber assembly. Previously the efficiency of thrust chambers had been substantially compromised by limiting the operating temperature to less than approximately 1300 degrees centigrade and by limiting the number of cycles to which the thruster could be subjected.

Thrust chamber assemblies are used in space for the maneuvering of satellites and otherwise. Improving the efficiency of the thruster and extending its life provides a substantial number of new alternatives in space applications. The same thrust can be obtained with less fuel and thus less weight. The savings in weight can be distributed between additional fuel and additional payload. Extending the life of the thruster and the number of cycles which it can withstand prolongs the useful life of the satellite or vehicle upon which it is mounted. Increasing the effective fuel capacity of the vehicle also extends its useful life.

Many applications exist outside of the space field for structures which are capable of withstanding shock, and high structure loads in highly corrosive high temperature environments. The absence of such structures limits or precludes the use of some reactions in the chemical process industry Such structures find application in propulsion systems and prime movers other than rockets. Other fields such as nuclear, metallurgical, and the like also require such structures to optimize or make possible various operations.

The platinum group metals and particularly iridium are capable of withstanding highly corrosive high temperature conditions, these platinum group metals do not, however, possess sufficient strength at high temperatures to withstand substantial loads. Certain refractory materials retain their strength at temperatures as high as 2,500 degrees centigrade or higher. Such refractory materials, however, are generally subject to rapid catastrophic oxidation at elevated temperatures.

Iridium is recognized as being the most corrosion resistant element known. It was, however, previously believed to be very brittle so that any significant elongation or flexing would cause it to fracture. It has been discovered that it is possible to form ductile iridium in useful shapes through the use of chemical vapor deposition techniques. These shaped objects are highly corrosion resistant and are adapted to be used in an oxidative environment at temperatures in excess of approximately 1500 degrees centigrade. Iridium alloys, formed through the sequential or codeposition of iridium and other materials also exhibit ductile characteristics.

A structure which is capable of withstanding high temperature, high stress, shock and catastrophically corrosive conditions can be produced according to the present invention by providing a corrosion bearer layer comprised of platinum group metal which is bonded through an interlayer to a layer of refractory material. The interlayer is an admixture of the corrosion bearer layer and the load bearing refractory layer. The corrosion resistant layer and interlayer protect the load bearing layer from catastrophic corrosion. Particularly, advantageous results have been achieved through the use of elemental iridium as the corrosion resistant layer and rhenium as the load bearing layer. Iridium is conveniently deposited on a mandrel which is subsequently removed. The deposit is thick enough to be separable from the mandrel. Rhenium is next deposited over the iridium layer under conditions which cause the formation of a metallurgical bond between the iridium and rhenium. The metallurgical bond takes the form of an interlayer in which the iridium and rhenium are admixed. The properties of the interlayer transition from those of the iridium to those of the rhenium, with the melting point of the interlayer increasing as it progresses from the iridium to the rhenium. The corrosion resistances of the layer decreases as it approaches the rhenium but remains closer to that of the iridium throughout most of the interlayer. The melting point of the transition layer increases faster than the corrosion resistance decreases as its composition moves from pure iridium toward pure rhenium. When the composition of the interlayer reaches approximately 80 percent rhenium, the corrosion resistance becomes insufficient to protect the structure from catastrophic corrosion. The mandrel is removed leaving a free standing structure. The interlayer is ductile. The structure is very shock resistant and not subject to cracking The metallurgical bond is very tight so that there is no tendency for the layers to delaminate. It has been found that the reverse procedure of depositing iridium on rhenium does not produce a metallurgical bond which is as satisfactory.

The life of the structure can be further prolonged by the application of a ceramic coating on at least the surface of the iridium which is exposed to the hot corrosive environment. The ceramic coating is brittle and will crack but usually not spall off, particularly under repeated cycles, but will provide some substantial protection for at least the initial part of the usage of the structure. Suitable ceramic coatings include, for example, hafnium dioxide and zirconium dioxide. The ceramic coating is formed by chemical vapor deposition procedures and is joined to the corrosion resistant layer under conditions which cause the formation of a bonding interlayer between the ceramic and the corrosion resistant layers. Typically the ceramic layer is deposited first on a mandrel under conditions where the ceramic layer does not bond to the mandrel and the corrosion resistant layer is next deposited over the mandrel onto the ceramic layer.

Chemical vapor deposition procedures are known and have been used for the better part of a century for forming various coatings. In general it is a method of plating on an atom by atom basis in which a gaseous compound of the material to be deposited is flowed over a heated substrate, resulting in the thermal decomposition or reduction of the compound and the subsequent deposition of the material onto the surface of the heated substrate. The parameters which must be controlled for successful reliable operation include the choice of gaseous compound, the concentration of the compound in the gas, the gas flow rate, the gas pressure, the nature of the substrate material, the geometry of the substrate, the temperature of the substrate, and the geometry of the reaction chamber. The nature of the deposit may be controlled by controlling these parameters. The crystal form may, for example, sometimes be changed by changing the gaseous compound. The degree of adherence to the substrate may be controlled, for example, by adjusting the temperature of the substrate. The deposits formed by chemical vapor deposition are generally very pure. Materials may be codeposited depending upon the composition of the gas which is supplied to the reactor. If the deposit is thick enough it may be separated from the mandrel to leave a free stranding structure. Both metallic and non-metallic materials may be deposited using these techniques and they may even be codeposited.

For the sake of convenience in describing and defining the process and the structure the structure has been referred to as comprising various layers of materials. If desired, however, it is possible with chemical vapor deposition techniques to provide a continuous variation in the composition of the structure from one pure material at one outer surface to another pure material at the opposed outer surface. Also, the variation in the composition need not be continuous. If ceramics are used on one outer surface it is possible to provide such a continuous variation in composition across three or more materials, not all of which are metallic.

Such graded deposits have no discontinuity and thus no stress concentration due to a mismatch of thermal expansion rates. Graded deposits are produced by varying the composition of the reactive gas as the deposit builds up. The description and definition of the process and structure is intended to include such graded deposits.

In general the chemical vapor deposition operation according to the present invention is controlled so that the first deposit is not necessarily chemically or metallurgically bonded to the mandrel. Subsequent deposits are bonded very tightly to one another through interlayers. Adjustment of the temperature of the substrate and the period of time during which the substrate is subjected to elevated temperatures is the preferred means of controlling the extent and nature of the bond. The preferred temperatures should be determined for each specific situation, and may vary considerably from one application to another.

The requirement that the structure be possessed of shock resistance and high strength at very high temperatures severely limits the choice of refractory materials for the high strength barrier or layer. Materials which have tensile strengths in excess of 5000 pounds per square inch at 2000 degrees centigrade include, for example, graphite, tungsten, Ta-10W, Mo-50Re, rhenium, and thoriated tungsten (W-1ThO$_2$) Of these materials only W-1ThO$_2$, rhenium and Mo-50Re have tensile strengths approximately in excess of 10000 pounds per square inch at 2000 degrees centigrade. Alloys, admixtures, and composites of these materials with each other and with other materials are also suitable for use as the structural barrier. Some forms of graphite are acceptable for use as the high strength layer when their linear coefficients of thermal expansion approximate that of the available corrosion resistant materials. The thickness of the structural layer is generally from about 20 to 60 mils although this can be adjusted depending upon the conditions of the end use of the structure. Thicker or thinner layers may be required or permitted in certain applications. Very high pressure applications may require much thicker structural layers.

The requirement that the corrosion resistant layer or barrier withstand shock and catastrophically corrosive conditions at temperatures in excess of 1500 and preferably in excess of 2000 or 2200 degrees centigrade for several hours severely limits the choice of materials for this layer or barrier. The platinum group metals and their alloys are about the only possible candidates for this barrier. Iridium and ruthenium and their alloys with each other and with, for example, platinum, rhodium and osmium, are suitable candidates. The addition, for example, of approximately 30 percent platinum or rhodium to iridium reduces the melting point of the alloy to approximately 2200 degrees centigrade but substantially increases the resistance of the material to oxidation. The thickness of the corrosion barrier is generally from about one half to 10 mils although this can be adjusted depending upon the conditions of the end use of the structure. Thicker or thinner corrosion barriers may be required or permitted in certain applications. The corrosion barrier must be sufficiently ductile to permit some elongation without cracking. Elongations in excess of 4 percent and preferably in excess of 6 percent are effective to prevent cracking. Iridium structures which have been carefully prepared by chemical vapor deposition procedures are inherently ductile. This permits the structural layer to deform somewhat under applied loads without destroying the integrity of the corrosion barrier. The structural layer would have to be very thick and heavy to resist deformation if the corrosion barrier were not ductile. Such a weight penalty would be unacceptable in many applications such as in space craft.

Where it is desired to protect exposed surfaces of the structure, and particularly the exposed surface of the corrosion barrier with a ceramic material there are a number of possible suitable materials. Hafnium dioxide and zirconium dioxide are very suitable, particularly when stabilized with an inversion inhibitor. Yttria, for example, has been used to inhibit the crystalline inversion of hafnium dioxide, but not in a vapor deposited coatings. Crystalline inversion occurs with hafnium dioxide at approximately 1600 degrees centigrade and causes cracking and spalling of hafnia coatings. Other borides, carbides and nitrides include for example, hafnium, tantalum, zirconium, tungsten, silicon and boron carbide, tantalum, hafnium, boron, zirconium, titanium and niobium nitride, hafnium, zirconium, tantalum, niobium and titanium boride. The ceramic layer, if used, is very thin and is not intended to provide the primary corrosion protection for the structural layer. The purpose of the ceramic barrier is to reduce the recession rate of the primary corrosion barrier. The ceramic and/or primary corrosion barrier may be applied to all of the exposed surfaces of the structure if desired. The thickness of the ceramic layer is generally one mil or less. This may be varied as conditions may require.

The following examples are submitted for the purpose of illustration only and not limitation.

A thrust chamber of conventional configuration having a length of 2.9 inches, a throat inside diameter of 0.17 inches, and a cylindrical chamber inside diameter of 0.35 inches was prepared. A molybdenum mandrel was prepared with an exterior shape which matched the desired interior shape of the thruster chamber. A hafnia coating was chemical vapor deposited on the mandrel from hafnium tetrachloride, hydrogen, air, and water vapor at 1200 degrees centigrade. The coating was allowed to build to a thickness of about 1 mil. An iridium layer was next chemical vapor deposited on the hafnia coating. The temperature was decreased to 400 degrees centigrade. The iridium was deposited from iridium pentanedionate. The layer was allowed to build to a thickness of about 1.4 mil. The temperature was raised to 1200 degrees centigrade and a rhenium layer was chemical vapor deposited by flowing rhenium pentachloride over the heated iridium coated mandrel. The rhenium layer was allowed to build to a thickness of about 40 mil The mandrel was dissolved out chemically. There appeared to be no significant bonding between the hafnia and the mandrel. Examination of the free standing structure revealed that bonding interlayers existed between the hafnia and the iridium and between the iridium and the rhenium. The interlayers were less than 0.1 mil thick but microscopic examination showed a smooth graded transition from one material to the other. The iridium to rhenium interlayer prepared by depositing rhenium on iridium appeared to be more evenly graded than the rhenium to iridium bond prepared by depositing iridium onto rhenium.

A substantially identical thrust chamber, weighing 57.79 grams and prepared in the same way was test fired for a total of about 1230 seconds in 5 different runs with various oxidizer to fuel ratios. The thrust chamber was pulsed for more than 1500 cycles. The operating temperatures ranged from about 1840 to 2200 degrees centigrade and the operating pressure was at about 110 pounds per square inch absolute. The thruster was examined after the test firings were completed. There was less than one half mil increase in the diameter of the throat. The weight decreased by 0.01 grams. The hafnia coating had cracked and even spalled off in one small area in the throat and in several areas in the barrel section. Under the spalled off sections there did not appear to be any corrosion past the hafnia-iridium interlayer. There did not appear to be any cracking or other damage to the iridium layer which would allow hot gases to reach the rhenium layer.

Samples were prepared using the above described chemical vapor deposition procedures for both bare iridium and hafnia coated iridium. The recession rates for each were determined at 2000 degrees centigrade. The recession rate for the hafnia coated iridium was less than about 5 percent that of the bare iridium.

As will be understood by those skilled in the art, what has been described are preferred embodiments in which modifications and changes may be made without departing from the spirit and scope of the accompanying claims.

What is claimed is:

1. A high temperature corrosion resistant metallic structure comprising:

A high temperature corrosion resistant first layer comprising platinum group metal having a melting point in excess of approximately 1500 degrees centigrade;

A second layer of refractory material having a tensile strength of greater than approximately 5,000 pounds per square inch at a temperature of approximately 1500 degrees centigrade; and A transition layer forming a metallurgical bond between said first and second layers, said transition layer comprising a solid solution of the materials in said first and second layers.

2. A high temperature corrosion resistant structure comprising a layer of ductile iridium, an interlayer of a solid solution of iridium and rhenium, said solid solution being ductile, and a layer of ductile rhenium, said interlayer being between and metallurigically bonding said layer of iridium to said layer to rhenium.

3. A high temperature corrosion resistant structure of claim 2 including a ceramic layer on an exposed surface of said layer of ductile iridium.

4. A high temperature corrosion resistant structure of claim 2 including a zirconium oxide layer on an exposed face of said layer of ductile iridium.

5. A high temperature corrosion resistant structure comprising a layer of ductile iridium, an interlayer of a solid solution of iridium and rhenium, said solid solution being ductile, and a layer of ductile rhenium, said interlayer being between and metallurgically bonding said layer of iridium to said layer of rhenium, said high temperature corrosion resistant structure including a hafnia layer on an exposed face of said layer of ductile iridium.

6. A high strength high temperature corrosion resistant metallic structure comprising:
   a first layer of high temperature corrosion resistant metal having a melting point in excess of about 2200 degrees centigrade;
   a second layer of refractory metal having a tensile strength of greater than approximately 10,000 pounds per square inch at a temperature of approximately 2000 degrees centrigrade; and
   a transition layer forming a metallurgical bond between said first and second layers, said transition layer being formed in situ and comprising a solid solution of the metals in said first and second layers.

* * * * *